United States Patent
Frackelton et al.

(10) Patent No.: US 10,373,474 B2
(45) Date of Patent: Aug. 6, 2019

(54) AUTO SETTING OF ALARM LIMITS

(71) Applicant: Keithley Instruments, LLC, Solon, OH (US)

(72) Inventors: Brian P. Frackelton, Macedonia, OH (US); George J. Polly, Brecksville, OH (US)

(73) Assignee: Keithley Instruments, LLC, Solon, OH (US)

( * ) Notice: Subject to any disclaimer, the term of this patent is extended or adjusted under 35 U.S.C. 154(b) by 0 days.

(21) Appl. No.: 15/710,741

(22) Filed: Sep. 20, 2017

(65) Prior Publication Data

US 2018/0261072 A1      Sep. 13, 2018

Related U.S. Application Data

(60) Provisional application No. 62/469,456, filed on Mar. 9, 2017.

(51) Int. Cl.
*G08B 21/00* (2006.01)
*G08B 21/18* (2006.01)
*G01R 31/08* (2006.01)

(52) U.S. Cl.
CPC ......... *G08B 21/185* (2013.01); *G01R 31/08* (2013.01)

(58) Field of Classification Search
None
See application file for complete search history.

(56) References Cited

U.S. PATENT DOCUMENTS

| | | | | |
|---|---|---|---|---|
| 2009/0125158 A1* | 5/2009 | Schweitzer | ........ | G01R 19/2513 700/293 |
| 2010/0305887 A1* | 12/2010 | Lakich | ............... | G01R 19/2513 702/60 |
| 2010/0317986 A1* | 12/2010 | Colman | ............... | A61B 5/0836 600/532 |
| 2014/0077963 A1* | 3/2014 | Dankers | .............. | E21B 41/0021 340/853.1 |
| 2015/0134198 A1* | 5/2015 | Masse | ................ | G05B 23/0235 701/34.2 |
| 2015/0233730 A1* | 8/2015 | Guillet | ................... | G01C 23/00 701/3 |
| 2015/0379864 A1* | 12/2015 | Janchookiat | ........ | H04L 41/0631 340/511 |
| 2016/0062464 A1* | 3/2016 | Moussette | ................ | G08B 6/00 345/173 |
| 2016/0253886 A1* | 9/2016 | Buchholz | ................. | G08B 7/06 340/501 |
| 2017/0370803 A1* | 12/2017 | Moutsouriz | ............ | B65G 43/00 |
| 2018/0018588 A1* | 1/2018 | Dalton | ................... | G06N 5/047 |
| 2018/0054063 A1* | 2/2018 | Parashar | .............. | G01R 31/086 |
| 2018/0095123 A1* | 4/2018 | Biswas | ................ | G01R 25/005 |

* cited by examiner

*Primary Examiner* — Julie B Lieu
(74) *Attorney, Agent, or Firm* — Miller Nash Graham & Dunn; Andrew J. Harrington

(57) ABSTRACT

A data acquisition system, including an input configured to receive a signal on a port and a processor. The processor determines, during an initial scan, a first measurement value of the signal on the port, sets at least one alarm value based on the first measurement value, the at least one alarm value being within a predetermined amount of the first measurement value, receives, during a subsequent scan, a second measurement value of the signal on the port, and generates an alert when the second measurement value violates the at least one alarm value.

20 Claims, 2 Drawing Sheets

AUTO SETTING OF ALARM LIMITS

PRIORITY

This disclosure claims benefit of U.S. Provisional Application No. 62/469,456, titled "AUTO SETTING OF ALARM LIMITS," filed on Mar. 9, 2017, which is incorporated herein by reference in its entirety.

FIELD OF THE INVENTION

This disclosure is directed to systems and methods related to test and measurement systems, and in particular, to automatically setting an alarm limit on a data acquisition system.

BACKGROUND

Dataloggers are used to collect measurements of a device under test (DUT). A scan is configured to walk through a series of channels on a DUT and take a measurement on each channel. This scan is normally repeated numerous times and can run for hours, days, or even months. When used in a long-term application, a user needs reassurance that the test is operating normally. A user may worry that the test has not operated normally and the data for the past month has been invalid due to a broken connection or some other sort of error. If there is an error, a user wants to know right away so that it can be fixed instead of gathering irrelevant data for weeks or months.

Examples in the disclosure address these and other issues.

BRIEF DESCRIPTION OF THE DRAWINGS

Aspects, features and advantages of embodiments of the present disclosure will become apparent from the following description of embodiments in reference to the appended drawings in which.

DESCRIPTION

Disclosed herein is a test and measurement instrument for automatically programming alarm limits to alert a user if the data collected is not as expected. The disclosed test and measurement instrument can learn the alarm limits and use the learned alarm limits during data scans to help ensure the data scans are performing within the bounds of what is expected.

Conventional dataloggers offer a feature for a user to program alarm limits so a user may be alerted when data is outside an expected range. For example, if channel 1 is measuring a voltage and the expected value of that channel is +5V, the customer can enter an alarm limit value from +4.5V to +5.5V. If the measurements at channel 1 stays within that expected range, no alarm event occurs. An alarm event occurs if the measurement is outside the expected range and a user is alerted to the measurement being outside the alarm limit values. This helps prevent a user from continuing to run a test on a device for an extended period of time when the test has already failed or contains problematic results. Establishing alarm limits in such a way becomes especially untenable when dealing with multi-channel configurations. In multi-channel configurations, the expected range can vary from one channel to the next depending upon the signals being processed by each channel and/or the aspects of the signals that are being logged. In addition, the alarm limits in such a conventional datalogger are set regardless of the actual signal being processed by the channel. Consequently, the user must pay close attention to the signal expected on each channel while entering the alarm limits or risk mistakenly entering inaccurate alarm limits leading to false/missed alarms. In addition, entering the alarm limits on conventional dataloggers is prone to entry errors (e.g., typographical entry errors) that can also lead to false/missed alarms. Typically, a datalogger may scan tens to hundreds of channels, and manually entering alarm limits for each channel is tedious for a user, especially manually entering the alarm limits from an instrument front panel.

Figure 1:
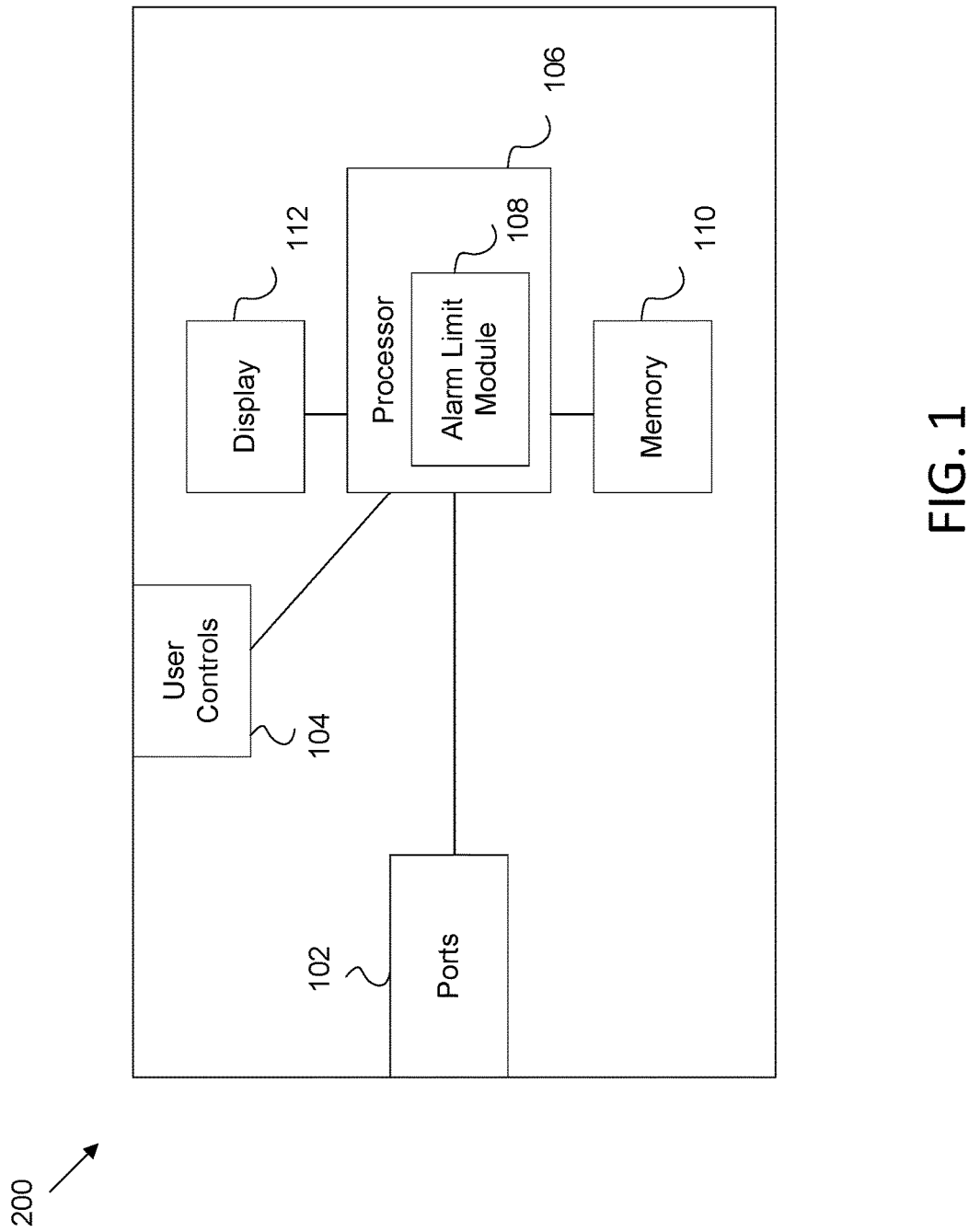
FIG. 1 is a schematic diagram of an example test and measurement system according to some embodiments of the disclosure.

FIG. 1 is a schematic diagram of an example test and measurement system, such as a datalogger or a data acquisition unit. System 100 includes ports 102, also referred to herein as channels, which may be any electrical, optical, and/or wireless ports configured to receive a signal for scanning and/or for communicating alerts to a user over a network. Ports 102 may include receivers, transmitters, and/or transceivers. Ports 102 are coupled to a processor 106, which may be implemented as a processor, an application specific integrated circuit (ASIC), a digital signal processor (DSP), a field programmable gate array (FPGA), etc. Processor 106 is configured to execute instructions from memory 110 and may perform any methods and/or associated steps indicated by the instructions. Processor 106 may include an alarm limit module 108, which may be configured to carry out a process for setting alarm limits as described herein. An example of such a process is depicted in method 200, described with respect to FIG. 2 below. In some embodiments, the alarm limit module 108 may be implemented via instructions that are in whole or in part contained within memory 110 as well. Memory 110 may be implemented as processor cache, random access memory (RAM), read only memory (ROM), solid state memory, hard disk drive(s), any other computer-readable storage media, or any combination thereof. Memory 110 acts as a medium for storing data, computer program products, and other instructions, and providing such data/products/instructions to the processor 106 for execution, computation, or other processing as needed.

User controls 104 are communicatively coupled to the processor 106. User controls 104 may include a keyboard, mouse, trackball, touchscreen, and/or any other controls employable by a user to interact with processor 106 and/or alarm limit module 108 (e.g., via a graphical user interface on a display 112). Display 112 may be a digital display (e.g., LCD, LED, etc.), a cathode ray tube based display, or any other monitor to display output of system 100 (e.g., results of alarm limit module 108, scan values, etc.) to an end user.

Figure 2:
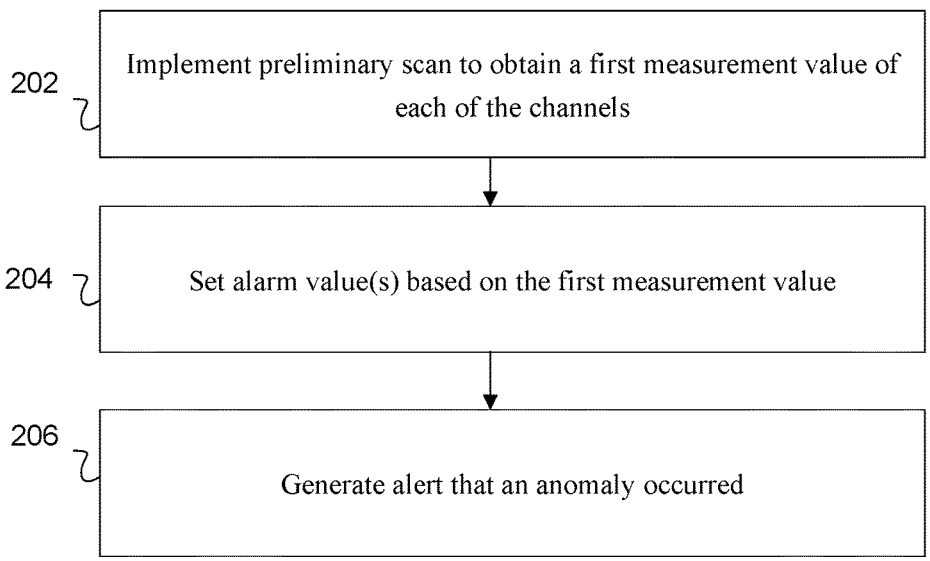
FIG. 2 is a flowchart of an example method according to some embodiments of the disclosure.

FIG. 2 is a flowchart of an example method 200 for automatically setting, or learning, alarm limits in a test and measurement instrument, such as the test and measurement instrument 100 discussed above, for example. Initially, a preliminary scan, also referred to herein as an initial scan, is performed at 202. During this preliminary scan the incoming signals for each channel of interest can be monitored and/or sampled to record a number of measurements for respective characteristics of the signals being processed by the channels of interest. The channels of interest can include any of the channels that are receiving a signal from at least one DUT and may be individually selected by a user (e.g., via a user interface) or automatically determined by test and measurement instrument 100 (e.g., based on those channels receiving signals, settings of the individual channels, etc.). The measurements recorded for each channel can be utilized to obtain a first measurement value of the respective characteristic of each signal. Each channel may measure a different characteristic. For example, one channel may measure voltage, another channel may measure current, etc. This could be of the same signal or different signals. Further, some channels may measure the same type of characteristic. That is, two channels may measure voltage while two other channels measure current. It will be appreciated that voltage and current are utilized merely as examples of possible characteristics and should not be viewed as limiting of this disclosure. The preliminary scan may be implemented at the beginning of a normal scan execution of the test and measurement instrument 100 to begin data logging, or may be performed in advance of when a user is beginning to configure a scan.

In some embodiments, multiple measurements may be taken during the preliminary scan of each channel, and the measurements taken for each respective channel can be utilized in determining the first measurement value. For instance, the measurements can be averaged to determine a respective first measurement value of each channel. For example, ten measurements may be taken of a signal on channel 1, and these measurements can be averaged to determine the first measurement value of channel 1. Ten measurements may also be taken of a signal on channel 2, and these measurements can also be averaged to determine the first measurement value of channel 2. However, any number of measurements may be taken during the preliminary scan, and embodiments disclosed herein are not limited to any specific number of measurements. In other instances, the first measurement value for a channel may be a maximum or a minimum of the measurements for the channel. It will be appreciated that the above are merely examples of how the measurements of a signal on a channel can be utilized to determine a first measurement value for that channel and that other methods of determining a first measurement value for the channel are contemplated herein.

Once the first measurement value is determined, an alarm value can then be set at 204 for each channel based on the first measurement value of each respective channel. The alarm value may be an upper alarm value or a lower alarm value. In some embodiments, both an upper alarm value and a lower alarm value can be determined for each channel. The alarm value can be determined based on a predetermined amount of variance from the first measurement value for each channel. That is, each channel may have different alarm values. Such as, for a channel measuring voltage, the alarm value may be 4.5V and 5.5V while a channel measuring resistance may have alarm values of 30 Ohms and 50 Ohms.

In some embodiments, the alarm value may be set based on a fixed variance from the first measurement value (e.g., +/−1V), a percentage variance from the first measurement value (e.g., +/−10%), or any other predetermined variance. For example, as seen in equation (1), an upper alarm value may be determined using the following formula, where Ri is the first measurement value, and P is the predetermined percentage:

$$\text{Upper Limit} = Ri*(1+P\,\%) \tag{1}$$

The lower limit may be determined using equation (2):

$$\text{Lower Limit} = Ri*(1-P\,\%) \tag{2}$$

In other embodiments, the alarm values may be determined based on a specific value B that is added or subtracted from the measurement value Ri, as shown in equations (3) and (4):

$$\text{Upper Limit} = Ri+B \tag{3}$$

$$\text{Lower Limit} = Ri-B \tag{4}$$

The predetermined percentage P or specific value B may be explicitly set by a user through the user controls 104, may be a pre-set value within the system stored in memory 110, or may be determined automatically (e.g., based on a standard deviation of the measurements). For example, the user may set the percentage P as 5% or may set a specific value B of 5. As will be readily understood by one skilled in the art, other percentages P and specific values B may be set, depending on what the user desires. In addition, the variances for the alarm values may vary between channels (e.g., some channels can include a predetermined percentage, while others can include a specific value, and still others can be determined automatically). The type of variance and any applicable value for the variance of each channel can be set by the user. The percentage P and specific value B may be entered before or after the preliminary scan.

In some embodiments, the predetermined percentage P or specific value B may be modified during data acquisition (e.g., a subsequent scan), as well. That is, using the user controls 104, during data acquisition, a user may modify the predetermined percentage P or specific value B to change the alarm value during the middle of the data acquisition.

After the alarm values are determined, the test and measurement instrument begins its data acquisition, or subsequent scan, to scan and take measurements of each of the channels connected to the DUT over an extended period of time. If there is an anomaly during the scan, then an alert is generated at 206. That is, the alert is generated at 206 if any of the measurements of any of the channels during the data acquisition violate the alarm value. As used in this context, for a measurement to violate an alarm value the measurement can be greater than or equal to the alarm value for an upper limit or less than or equal to the alarm value for a lower limit. In some embodiments, method 200 can enable a user to enter a single variance value (e.g., percentage or fixed) or standard deviation value and then the test and measurement instrument can learn the alarm value for each of the channels. This can save the user time and can prevent mistakes by a user entering an incorrect alarm value. In addition, the user can review the learned alarm values as a configuration validation (e.g., if a channels alarm value is inconsistent with what the user expected then the channel may not be connected as the user anticipated).

The alert generated by the processor may trigger a traditional datalogger event, such as a digital input/output line, display annunciator, etc., or a more modern event, such as an email notification or notification to a mobile device (e.g., standard messaging system (SMS) text), etc.

Aspects of the invention may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), and dedicated hardware controllers. One or more aspects of the invention may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the invention, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Examples of the invention may operate on a particularly created hardware, on firmware, digital signal processors, or on a specially programmed general-purpose computer including a processor operating according to programmed instructions. The terms "controller" or "processor" as used herein are intended to include microprocessors, microcomputers, ASICs, and dedicated hardware controllers. One or more aspects of the invention may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, RAM, etc. As will be appreciated by one of skill in the art, the functionality of the program modules may be combined or distributed as desired in various examples. In addition, the functionality may be embodied in whole or in part in firmware or hardware equivalents such as integrated circuits, field programmable gate arrays (FPGA), and the like. Particular data structures may be used to more effectively implement one or more aspects of the invention, and such data structures are contemplated within the scope of computer executable instructions and computer-usable data described herein.

Aspects of the present disclosure operate with various modifications and in alternative forms. Specific aspects have been shown by way of example in the drawings and are described in detail herein below. However, it should be noted that the examples disclosed herein are presented for the purposes of clarity of discussion and are not intended to limit the scope of the general concepts disclosed to the specific examples described herein unless expressly limited. As such, the present disclosure is intended to cover all modifications, equivalents, and alternatives of the described aspects in light of the attached drawings and claims.

References in the specification to embodiment, aspect, example, etc., indicate that the described item may include a particular feature, structure, or characteristic. However, every disclosed aspect may or may not necessarily include that particular feature, structure, or characteristic. Moreover, such phrases are not necessarily referring to the same aspect unless specifically noted. Further, when a particular feature, structure, or characteristic is described in connection with a particular aspect, such feature, structure, or characteristic can be employed in connection with another disclosed aspect whether or not such feature is explicitly described in conjunction with such other disclosed aspect.

The disclosed aspects may be implemented, in some cases, in hardware, firmware, software, or any combination thereof. The disclosed aspects may also be implemented as instructions carried by or stored on one or more or computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include Random Access Memory (RAM), Read Only Memory (ROM), Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 is a data acquisition system, including a port configured to receive a signal; and one or more processors. The one or more processors are configured to monitor the signal during an initial scan to establish a plurality of measurements of the signal; determine a first measurement value of the signal based on the plurality of measurements; set an alarm value based on the first measurement value, the alarm value being within a predetermined amount of the first measurement value; receive, during a subsequent scan, a second measurement value of the signal; detect that the second measurement value violates the alarm value; and generate an alert in response to detecting that the second measurement value violates the alarm value.

Example 2 is the data acquisition system of example 1, wherein the alarm value is a first alarm value, and the processor is further configured to set a second alarm value based on the first measurement value, the first alarm value representing an upper alarm value and the second alarm value representing a lower alarm value; and generate the alert when the second measurement value equals or exceeds the upper alarm value, or the second measurement value equals or is less than the lower alarm value.

Example 3 is the data acquisition system of examples 1 or 2, wherein the first measurement value is determined by averaging the plurality of measurements.

Example 4 is the data acquisition system of any one of examples 1-3, further comprising a second port configured to receive a second signal, wherein the alarm value is a first alarm value. The processor is further configured to determine, during the initial scan, a first measurement value of the second signal; set a second alarm value based on the first measurement value of the second signal, the second alarm value being within a predetermined amount of the first measurement value of the second signal; receive, during a subsequent scan, a second measurement value of the second signal on the second port; and generate an alert when the second measurement value violates the second alarm value.

Example 5 is the data acquisition system of example 4, wherein the first measurement value of the first port is associated with a first characteristic and the first measurement value of the second port is associated with a second characteristic different than the first characteristic.

Example 6 is the data acquisition system of any one of examples 1-5, further comprising a user input, the user input configured to receive the predetermined amount.

Example 7 is the data acquisition system of any one of examples 1-6, wherein the predetermined amount is a percentage.

Example 8 is the data acquisition system of example 7, wherein the alarm value is determined by multiplying the first measurement value by one plus the percentage or multiplying the first measurement value by one minus the percentage.

Example 9 is the data acquisition system of any one of examples 1-8, wherein the predetermined amount is a fixed value, and wherein the alarm value is set by adding the fixed value to the first measurement value or subtracting the fixed value from the first measurement value.

Example 10 is a method for alerting a user of an error during a data acquisition. The method includes receiving a signal at each of one or more channels; monitor the signal at each of the one or more channels during an initial scan to establish a plurality of measurements of the signal; determining a first measurement value of a characteristic of the signal received at each of the one or more channels based on the plurality of measurements; setting at least one alarm value for each of the one or more channels based on the respective first measurement value; receiving, during a subsequent scan, a second measurement value of the characteristic of the signal received at each of the one or more channels; detecting that the second measurement value of any one of the one or more channels violates the at least one alarm value; and generating an alert in response to detecting that the second measurement value of any one of the one or more channels violates the respective at least one alarm value.

Example 11 is the method of example 10, further including setting at least two alarm values based on the first measurement value of the characteristic of the signal received at each of the one or more channels, the at least two alarm values including an upper alarm value and a lower alarm value; and generating the alert when the second measurement value of the characteristic of any of the signals received at each of the one or more channels equals or exceeds the upper alarm value, or the second measurement value of the characteristic of any of the signals received at each of the one or more channels equals or is less than the lower alarm value.

Example 12 is the method of either example 10 or 11, wherein the first measurement value is determined by averaging the plurality of measurements for each of the one or more channels.

Example 13 is the method of any one of examples 10-12, wherein the predetermined amount is a percentage.

Example 14 is the method of example 13, wherein the alarm value is determined by multiplying the first measurement value by one plus the percentage or multiplying the first measurement value by one minus the percentage.

Example 15 is the method of any one of examples 10-14, wherein the predetermined amount is fixed value, and wherein the at least one alarm value is set by adding the fixed value to the first measurement value or subtracting the fixed value from the first measurement value.

Example 16 is a computer readable storage medium having instructions stored thereon that, when executed by a processor of a test and measurement instrument, cause the test and measurement instrument to receive a signal from at least one device under test at each of one or more channels; monitor the signal during an initial scan to measure a characteristic of the signal received at each of the one or more channels; set an alarm value for each of the one or more channels based on the measurement of the characteristic during the initial scan; measure, during a subsequent scan, the characteristic of the signal received at each of the one or more channels; detect that the characteristic measured during the subsequent scan of the signal received at one of the one or more channels violates the respective alarm value; and generate an alert in response to detecting that the measurement of the characteristic during the subsequent scan of the one or more channels violates the respective alarm value.

Example 17 is the computer-readable storage medium of example 16, wherein the alarm value is a first alarm value, and the computer-readable storage medium further includes instructions stored thereon that, when executed by the processor of the test and measurement instrument, cause the test and measurement instrument to set a second alarm value based on the first measurement value of the characteristic of the signal received at each of the one or more channels during the initial scan, the first alarm value representing an upper alarm value and the second alarm value representing a lower alarm value; and generate the alert when the measurement of the characteristic of any of the signals received at each of the one or more channels during the subsequent scan equals or exceeds the upper alarm value, or the measurement of the characteristic of any of the signals received at each of the one or more channels during the subsequent scan equals or is less than the lower alarm value.

Example 18 is the computer-readable storage medium of either example 16 or 17, wherein the predetermined amount is a percentage.

Example 19 is the computer-readable storage medium of example 18, wherein the alarm value is determined by multiplying the first measurement value by one plus the percentage or multiplying the first measurement value by one minus the percentage.

Example 20 is the computer-readable storage medium of any one of examples 16-19, wherein the predetermined amount is a fixed value, and wherein the at least one alarm value is set by adding the fixed value to the first measurement value or subtracting the fixed value from the first measurement value.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

We claim:

1. A data acquisition system, comprising:
    a plurality of ports, each port configured to receive a respective one of a plurality of signals;
    one or more processors coupled to the plurality of ports; and
    a memory coupled to the one or more processors,
    wherein the one or more processors are configured to:
        determine one or more channels of interest, each channel of interest receiving a corresponding signal of interest;
        initiate a preliminary scan of the channels of interest;
        during the preliminary scan, record in the memory a plurality of measurements of each signal of interest;
        determine a first measurement value of each signal of interest based on the plurality of measurements;
        for each signal of interest, set an alarm value based on the first measurement value, the alarm value being within a predetermined amount of the first measurement value;
        initiate a subsequent scan of the channels of interest;
        receive, during the subsequent scan, a second measurement value of each signal of interest;
        detect that the second measurement value of one of the signals of interest violates the corresponding alarm value;
        generate an alert in response to detecting that the second measurement value of one of the signals of interest violates the corresponding alarm value; and
        record the second measurement value of each signal of interest in the memory.

2. The data acquisition system of claim 1, wherein the alarm value is a first alarm value, and wherein the processor is further configured to:
    for each signal of interest, set a second alarm value based on the first measurement value, the first alarm value representing an upper alarm value and the second alarm value representing a lower alarm value; and
    generate the alert when:
        the second measurement value of one of the signals of interest equals or exceeds the corresponding upper alarm value, or
        the second measurement value of one of the signals of interest equals or is less than the corresponding lower alarm value.

3. The data acquisition system of claim 1, wherein the first measurement value of each signal of interest is determined by averaging the plurality of measurements of each signal of interest.

4. The data acquisition system of claim 1, wherein the processor is further configured to:
    determine the channels of interest based on a user selection.

5. The data acquisition system of claim 1, wherein the processor is further configured to automatically determine the channels of interest based on the signals received at the corresponding ports.

6. The data acquisition system of claim 1, further comprising a user input, the user input configured to receive the predetermined amount.

7. The data acquisition system of claim 1, wherein the predetermined amount is a percentage.

8. The data acquisition system of claim 7, wherein the alarm value is determined by multiplying the first measurement value by one plus the percentage or multiplying the first measurement value by one minus the percentage.

9. The data acquisition system of claim 1, wherein the predetermined amount is a fixed value, and wherein the alarm value is set by adding the fixed value to the first measurement value or subtracting the fixed value from the first measurement value.

10. A method for alerting a user of an error during a data acquisition, the method comprising:
    receiving a signal at each of one or more channels;
    determining one or more channels of interest of the one or more channels, each channel of interest receiving a corresponding signal of interest;
    initiating a preliminary scan of the channels of interest;
    during the preliminary scan, recording, in a memory, a plurality of measurements of each signal of interest;
    determining a first measurement value of a characteristic of each signal of interest based on the plurality of measurements;
    for each signal of interest, setting at least one alarm value based on the respective first measurement value, the alarm value being within a predetermined amount of the first measurement value;

initiating a subsequent scan of the channels of interest;

receiving, during the subsequent scan, a second measurement value of the characteristic of each signal of interest;

detecting that the second measurement value of one of the signals of interest violates the corresponding at least one alarm value; and generating an alert in response to detecting that the second measurement value of one of the signals of interest violates the corresponding at least one alarm value; and recording, in the memory, the second measurement value of the characteristic of each of the signals of interest.

11. The method of claim 10, further comprising:

for each signal of interest, setting at least two alarm values based on the first measurement value of the characteristic, the at least two alarm values including an upper alarm value and a lower alarm value; and generating the alert when:
- the second measurement value of the characteristic of one of the signals of interest equals or exceeds the upper alarm value, or
- the second measurement value of the characteristic of one of the signals of interest equals or is less than the lower alarm value.

12. The method of claim 10, wherein the first measurement value of each signal of interest is determined by averaging the plurality of measurements of each signal of interest.

13. The method of claim 10, wherein the predetermined amount is a percentage.

14. The method of claim 10, wherein determining one or more channels of interest further comprises receiving a user selection through a user interface.

15. The method of claim 10, wherein determining one or more channels of interest further comprises automatically determining a channel of interest based on activity of the signals received at the one or more channels.

16. A computer readable storage medium having instructions stored thereon that, when executed by a processor of a test and measurement instrument, cause the test and measurement instrument to:

receive a signal from at least one device under test at each of one or more channels;

determine one or more channels of interest of the one or more channels, each channel of interest receiving a corresponding signal of interest from the at least one device under test;

initiate a preliminary scan of the channels of interest;

during the preliminary scan, record, in a memory of the test and measurement instrument, a measurement of a characteristic of each signal of interest;

for each signal of interest, set an alarm value based on the respective measurement of the characteristic during the preliminary scan, the alarm value being within a predetermined amount of the measurement of the characteristic;

initiate a subsequent scan of the channels of interest;

measure, during the subsequent scan, the characteristic of each signal of interest;

detect that the characteristic of one of the signals of interest measured during the subsequent scan of the channels of interest violates the respective alarm value;

generate an alert in response to detecting that the measurement of the characteristic of one of the signals of interest during the subsequent scan of the channels of interest violates the respective alarm value; and record, in the memory, the measurement of the characteristic of each of the signals of interest.

17. The computer-readable storage medium of claim 16, wherein the alarm value is a first alarm value, and the computer-readable storage medium further includes instructions stored thereon that, when executed by the processor of the test and measurement instrument, cause the test and measurement instrument to:

for each signal of interest, set a second alarm value based on the respective measurement of the characteristic during the preliminary scan, the first alarm value representing an upper alarm value and the second alarm value representing a lower alarm value; and generate the alert when:
- the measurement of the characteristic of any of the signals of interest during the subsequent scan equals or exceeds the corresponding upper alarm value, or
- the measurement of the characteristic of any the signals of interest during the subsequent scan equals or is less than the corresponding lower alarm value.

18. The computer-readable storage medium of claim 16, wherein the predetermined amount is a percentage.

19. The computer-readable storage medium of claim 16, wherein the one or more channels of interest are determined based on a user selection.

20. The computer-readable storage medium of claim 16, wherein the one or more channels of interest are determined automatically, by the test and measurement instrument, based on activity of the signals received from the at least one device under test at the one or more channels.

* * * * *